United States Patent
Sinclair et al.

(10) Patent No.: US 10,374,612 B1
(45) Date of Patent: Aug. 6, 2019

(54) ANCILLA QUBIT DEVICES IN A SUPERCONDUCTING QUANTUM PROCESSOR

(71) Applicant: Rigetti & Co, Inc., Berkeley, CA (US)

(72) Inventors: Rodney Franklyn Sinclair, El Cerrito, CA (US); Matthew J. Reagor, Corte Madera, CA (US)

(73) Assignee: Rigetti & Co, Inc., Berkeley, CA (US)

(*) Notice: Subject to any disclaimer, the term of this patent is extended or adjusted under 35 U.S.C. 154(b) by 0 days.

(21) Appl. No.: 16/151,902

(22) Filed: Oct. 4, 2018

Related U.S. Application Data

(60) Provisional application No. 62/569,104, filed on Oct. 6, 2017.

(51) Int. Cl.
   *H03K 19/195* (2006.01)
   *H01L 29/12* (2006.01)
   *G06N 10/00* (2019.01)

(52) U.S. Cl.
   CPC ........... *H03K 19/195* (2013.01); *G06N 10/00* (2019.01); *H01L 29/127* (2013.01)

(58) Field of Classification Search
   None
   See application file for complete search history.

(56) References Cited

U.S. PATENT DOCUMENTS

| | | |
|---|---|---|
| 6,900,456 B2 | 5/2005 | Blais et al. |
| 7,655,850 B1 | 2/2010 | Ahn |

(Continued)

FOREIGN PATENT DOCUMENTS

| | | |
|---|---|---|
| WO | 2015178990 A2 | 11/2015 |
| WO | 2015178991 A2 | 11/2015 |

(Continued)

OTHER PUBLICATIONS

Horodecki, et al., "General teleportation channel, singlet fraction and quasi-distillation", arXiv:quant-ph/9807091v2, Mar. 2, 1999, 16 pgs.

(Continued)

*Primary Examiner* — Anh Q Tran
(74) *Attorney, Agent, or Firm* — Henry Patent Law Firm PLLC

(57) ABSTRACT

In a general aspect, a quantum computing system includes ancilla qubit devices. In some aspects, a quantum computing system includes a quantum processor cell that includes a superconducting quantum circuit system. The superconducting quantum circuit system includes a tunable-frequency primary qubit device; a flux-bias device coupled to the tunable-frequency primary qubit device; and a fixed-frequency ancilla qubit device. The fixed-frequency ancilla qubit device is connected only to the tunable-frequency primary qubit device in the superconducting quantum circuit system. The quantum computing system also includes a control system communicably coupled to the quantum processor cell. The control system is configured to apply a parametrically-activated two-qubit quantum logic gate to the tunable-frequency primary qubit device and the fixed-frequency ancilla qubit device by sending, to the flux-bias device, a radio-frequency control signal that modulates the tunable-frequency primary qubit device.

30 Claims, 4 Drawing Sheets

(56) References Cited

U.S. PATENT DOCUMENTS

| | | | |
|---|---|---|---|
| 7,932,515 | B2 | 4/2011 | Bunyk |
| 8,642,998 | B2 | 2/2014 | Gambetta et al. |
| 8,872,360 | B2 | 10/2014 | Chow et al. |
| 9,317,473 | B2 | 4/2016 | Yao et al. |
| 9,892,365 | B2 | 2/2018 | Rigetti et al. |
| 10,056,908 | B2 | 8/2018 | Rigetti et al. |
| 2004/0109631 | A1 | 6/2004 | Franson |
| 2006/0169877 | A1 | 8/2006 | Goto et al. |
| 2007/0194225 | A1 | 8/2007 | Zorn |
| 2010/0079833 | A1 | 4/2010 | Langford et al. |
| 2010/0251049 | A1 | 9/2010 | Goto et al. |
| 2012/0319684 | A1 | 12/2012 | Gambetta et al. |
| 2014/0025926 | A1 | 1/2014 | Yao et al. |
| 2014/0264285 | A1 | 9/2014 | Chow |
| 2015/0034808 | A1 | 2/2015 | Yuan et al. |
| 2016/0267032 | A1 | 9/2016 | Rigetti et al. |
| 2016/0292586 | A1 | 10/2016 | Rigetti et al. |
| 2017/0116542 | A1 | 4/2017 | Shim et al. |
| 2017/0193388 | A1* | 7/2017 | Filipp ............... G06N 10/00 |
| 2017/0230050 | A1 | 8/2017 | Rigetti et al. |
| 2018/0260729 | A1 | 9/2018 | Abdo et al. |
| 2019/0007051 | A1* | 1/2019 | Sete ................ H03K 19/195 |

FOREIGN PATENT DOCUMENTS

| | | |
|---|---|---|
| WO | 2015178992 A2 | 11/2015 |
| WO | 2017078731 | 5/2017 |

OTHER PUBLICATIONS

Horodecki, et al., "General teleportation channel, singlet fraction and quasi-distillation", Physical Review A 60, 1888, Sep. 1999, 11 pgs.

Hradil, et al., "Maximum-likelihood methods in quantum mechanics", Quantum State Estimation (Springer, 2004) pp .59-112, 2004, 55 pgs.

Hutchings, et al., "Tunable Superconducting Qubits with Flux-Independent Coherence", arXiv:1702.02253v2, Feb. 21, 2017, 17 pgs.

Hutchings, et al., "Tunable Superconducting Qubits with Flux-Independent Coherence", Phys. Rev. Applied 8, 044003, Oct. 12, 2017, 17 pgs.

Ithier, et al., "Decoherence in a superconducting quantum bit circuit", Phys. Rev. B 72, 134519, 2005, 22 pgs.

Ithier, et al., "Decoherence in a superconducting quantum bit circuit", Quantronics group, Service de Physique de l'Etat Condense, Aug. 2, 2005, 66 pgs.

Jerger, et al., "In situ characterization of qubit control lines: a qubit as a vector network analyzer", arXiv:1706.05829v1 [quant-ph], Jun. 19, 2017, 5 pgs.

Kamenev, "Field Theory of Non-Equilibrium Systems", Cambridge University Press, 2011, 40 pgs.

Kandala, et al., "Hardware-efficient Variational Quantum Eigensolver for Small Molecules and Quantum Magnets", arXiv:1704.05018v2, Oct. 13, 2017, 24 pgs.

Kelly, et al., "3D integration of superconducting qubits with bump bonds: Part 2", APA Meeting, Mar. 2017, 1 pg.

Kelly, et al., "State preservation by repetitive error detection in a superconducting quantum circuit", Dept of Physics, Univ. of California, Santa Barbara, CA, US, 2015, 30 pgs.

Kelly, J., et al., "State preservation by repetitive error detection in a superconducting quantum circuit", Nature 519, 66, Mar. 5, 2015, 4 pgs.

Kerman, et al., "High-fidelity quantum operations on superconducting qubits in the presence of noise", arXiv:0801.0761v2, Mar. 19, 2008, 5 pgs.

Kerman, et al., "High-fidelity quantum operations on superconducting qubits in the presence of noise", Phys. Rev. Lett. 101, 070501, Mar. 19, 2008, 4 pgs.

Knill, et al., "Randomized benchmarking of quantum gates", Physical Review A 77, 012307, 2008, 7 pgs.

Koch, et al., "Charge insensitive qubit design derived from the Cooper pair box", arXiv:cond-mat/0703002v2 [cond-mat.mess-hall], Sep. 26, 2007, 21 pgs.

Koch, Jens, et al., "Charge-insensitive qubit design derived from the Cooper pair box", Physical Review A 76, 042319, Oct. 12, 2007, 19 pages.

Koch, et al., "Flicker (l/f) Noise in Tunnel Junction DC Squids", Journal of Low Temperature Physics 51, p. 207, 1983, 18 pgs.

Koch, et al., "Model for 1/f Flux Noise in SQUIDS and Qubits", Physical Review Letters 98, 267003, Jun. 2007, 4 pgs.

Koch, et al., "Model for 1/f Flux Noise in SQUIDS and Qubits", IBM Research Div, Thomas J. Watson Research Center, Yorktown Heights, NY; Dept. of Physics, UC-Berkeley, California; Materials Sciences Div., Lawrence Berkeley Nat'l Laboratory, Berkeley, California, May 5, 2007, 17 pgs.

Koch, et al., "Origin and Suppression of 1/f Magnetic Flux Noise", arXiv:1604.00877v1, Apr. 4, 2016, 13 pgs.

Kubica, Aleksander, et al., "Unfolding the Color Code", New Journal of Physics 17, 083026, Aug. 13, 2015, 26 pages.

Kumar, et al., "Origin and Reduction of 1/f Magnetic Flux Noise in Superconducting Devices", Phys. Rev. Applied 6, 041001, 2016, 5 pgs.

Landahl, Andrew J., et al., "Fault-tolerant quantum computing with color codes", arXiv:1108.5738v1 [quant-ph], Aug. 29, 2011, 28 pages.

Langford, et al., "Experimentally simulating the dynamics of quantum light and matter at ultrastrong coupling", arXiv:1610.10065, Oct. 31, 2016, 26 pgs.

Lecocq, et al., "Junction fabrication by shadow evaporation without a suspended bridge", Nanotechnology 22 (2011) 315302, Jul. 8, 2011, 5 pgs.

Leek, et al., "Using Sideband Transitions for Two-Qubit Operations in Superconducting Circuits", Phys. Rev. B 79, 180511, 2009, 4 pgs.

Leek, et al., "Using Sideband Transitions for Two-Qubit Operations in Superconducting Circuits", arXiv:0812.2678v1, Dec. 15, 2008, 4 pgs.

Lucero, et al., "3D integration of superconducting qubits with bump bonds: Part 3", APS Meeting, Mar. 2017, 1 pg.

Magesan, et al., "Characterizing Quantum Gates via Randomized Benchmarking", arXiv:1109.6887v2 [quant-ph], Apr. 27, 2012, 21 pgs.

Magesan, Easwar, et al., "Efficient measurement of quantum gate error by interleaved randomized benchmarking", arXiv:1203.4550v2 [quant-ph], Mar. 19, 2014, 7 pages.

Magesan, et al., "Efficient measurement of quantum gate error by interleaved randomized benchmarking", Phys. Rev.Lett.109.080505, Aug. 2012, 5 pgs.

Magesan, et al., "Robust randomized benchmarking of quantum processes", arXiv:1009.3639v1, Sep. 19, 2010, 5 pgs.

Magesan, et al., "Scalable and Robust Randomized Benchmarking of Quantum Processes", Physical Review Letters 106, 180504, May 2011, 4 pgs.

Martinis, et al., "Decoherence in Josephson Qubits from Dielectric Loss", Phys. Rev. Lett. 95, 210503, Nov. 16, 2005, 4 pgs.

Martinis, et al., "Fast adiabatic qubit gates using only σz control", Physical Review A 90, 022307, 2014, 9 pgs.

McKay, David C., et al., "A universal gate for fixed-frequency qubits via a tunable bus", arXiv:1604.03076v3 [quant-ph], Dec. 19, 2016, 12 pages.

McKay, et al., "Universal Gate for Fixed-Frequency Qubits via a Tunable Bus", Phys. Rev. Applied 6, 064007, 2016, 10 pgs.

Meiboom, et al., "Modified Spin-Echo Method for Measuring Nuclear Relaxation Times", Review of Scientific Instruments 29, p. 688, 1958, 4 pgs.

Mohseni, et al., "Commercialize early quantum technologies", Nature 543, Mar. 9, 2017, 5 pgs.

Müller, et al., "Deriving Lindblad master equations with Keldysh diagrams: Correlated gain and loss in higher order perturbation theory", Phys. Rev. A 95, 013847, Jan. 27, 2017, 24 pgs.

(56) References Cited

OTHER PUBLICATIONS

Müller, et al., "Keldysh meets Lindblad: Correlated Gain and Loss in Higher-Order Perturbation Theory", arXiv:1608.04163v2, Jan. 30, 2017, 27 pgs.
Mutus, et al., "3D integration of superconducting qubits with bump bonds: Part 1", APS Meeting, Mar. 2017, 1 pg.
Naik, R. K., et al., "Random access quantum information processors", arXiv:1705.00579v1 [quant-ph], May 1, 2017, 7 pages.
Neeley, et al., "Process tomography of quantum memory in a Josephson-phase qubit coupled to a two-level state", nature physics, vol. 4, Jul. 2008, 4 pgs.
Nielsen, "A simple formula for the average gate fidelity of a quantum dynamical operation", arXiv:quant-ph/0205035v2, May 12, 2002, 3 pgs.
Nielsen, et al., "A simple formula for the average gate fidelity of a quantum dynamical operation", Physics Letters A 303, 249, May 12, 2002, 4 pgs.
Niskanen, et al., "Quantum Coherent Tunable Coupling of Superconducting Qubits", Science 316, 723, 2007, 5 pgs.
Niskanen, Antti O, et al., "Tunable coupling scheme for flux qubits at the optimal point", Physical Review B 73, 094506, Mar. 15, 2006, 8 pages.
Strauch, Frederick W., "Quantum logic gates for superconducting resonator qudits", Physical Review A, 84, 052313, Nov. 2011, 9 pages.
Takita, et al., "Demonstration of Weight-Four Parity Measurements in the Surface Code Architecture", arXiv:1605.01351v3 [quant-ph], Apr. 28, 2017, 8 pgs.
Takita, et al., "Demonstration of Weight-Four Parity Measurements in the Surface Code Architecture", Phys. Rev. Lett. 117, 210505, Nov. 2016, 5 pgs.
Timmer, et al., "On generating power law noise", Astron. Astrophys. 300, 707-710, 1995, 4 pgs.
Vahidpour, et al., "Superconducting Through-Silicon Vias for Quantum Integrated Circuits", arXiv:1708.02226v1 [physics.app-ph], Aug. 7, 2017, 5 pgs.
Versluis, et al., "Scalable quantum circuit and control for a superconducting surface code", arXiv:1612.08208v1, Dec. 24, 2016, 9 pgs.
Vion, et al., "Manipulating the Quantum State of an Electrical Circuit", Science 296, 886, 2002, 5 pgs.
Vion, et al., "Manipulating the Quantum State of an Electrical Circuit", arXiv:cond-mat/0205343v2, May 29, 2002, 5 pgs.
Wallraff, et al., "Circuit Quantum Electrodynamics: Coherent Coupling of a Single Photon to a Cooper Pair Box", arXiv:cond-mat/0407325v1 [cond-mat.mes-hall], Jul. 13, 2004, 8 pgs.
Wallraff, et al., "Strong coupling of a single photon to a superconducting qubit using circuit quantum electrodynamics", Nature 431, 162, Sep. 9, 2004, 6 pgs.
Wang, "Candidate Source of Flux Noise in SQUIDs: Adsorbed Oxygen Molecules", arXiv:1504.08075, Apr. 30, 2015, 24 pgs.
Wang, et al., "Candidate Source of Flux Noise in SQUIDs: Adsorbed Oxygen Molecules", Phys. Rev. Lett 115, 077002, Aug. 2015, 5 pgs.
Wellstood, et al., "Low-frequency noise in dc superconducting quantum interference devices below 1 K", Appl. Phys. Lett. 50, 772, Mar. 1987, 4 pgs.
Wendin, "Quantum information processing with superconducting circuits: a review", arXiv:1610.02208v1 [quant-ph], Oct. 7, 2016, 94 pgs.
Wendin, "Quantum Information Processing with Superconducting Circuits: a Review", arXiv:1610.02208v2, Oct. 8, 2017, 108 pgs.
Yamamoto, et al., "Quantum process tomography of two-qubit controlled-Z and controlled-NOT gates using superconducting phase qubits", Phys. Rev. B 82, 184515 (2010), 8 pgs.
USPTO, Non-Final Office Action dated Nov. 28, 2018, in U.S. Appl. No. 16/012,551, 20 pages.
KIPO, International Search Report and Written Opinion dated Oct. 10, 2018, in PCT/US2018/038355.

"Quantum machines: Measurement and control of engineered quantum systems", Lecture notes of the Les Houches Summer School, vol. 96, Jul. 2011, 2014, 11 pgs.
Abramowitz, et al., "Handbook of Mathematical Functions with Formulas, Graphs, and Mathematical Tables", Dover, 1964, 470 pgs.
Aliferis, et al., "Quantum accuracy threshold for concatenated distance-3 codes", arXiv:quant-ph/0504218v3, Oct. 21, 2005, 58 pgs.
Barenco, Adriano, et al., "Elementary gates for quantum computation", Physical Review A, vol. 52, No. 5, Nov. 1, 1995, 11 pgs.
Barends, et al., "Coherent Josephson Qubit Suitable for Scalable Quantum Integrated Circuits", arXiv:1304.2322v1 [quant-ph], Apr. 8, 2013, 10 pgs.
Barends, et al., "Digitized adiabatic quantum computing with a superconducting circuit", arXiv:1511.03316, Nov. 10, 2015.
Barends, et al., "Superconducting quantum circuits at the surface code threshold for fault tolerance", Nature 508, 2014, pp. 500-503.
Beaudoin, et al, "First-order sidebands in circuit QED using qubit frequency modulation", arXiv:1208.1946v1 [quant-ph], Aug. 9, 2012, 16 pgs.
Bergeal, et al., "Phase preserving amplification near the quantum limit with a Josephson Ring Modulator", arXiv:0912.3407v1 [cond-mat.mes-hall], Dec. 17, 2009, 20 pgs.
Bertet, P., et al., "Parametric coupling for superconducting qubits", Physical Review B 73, 064512, Feb. 14, 2006, 6 pages.
Bertet, et al., "Parametric coupling for superconducting qubits", arXiv:cond-mat/0509799v2 [cond-mat.mes-hall], Mar. 16, 2006, 6 pgs.
Bialczak, et al., "1/f Flux Noise in Josephson Phase Qubits", arXiv:0708.2125v1 [cond-mat.supr-con], Aug. 16, 2007, 4 pgs.
Blais, Alexandre, et al., "Cavity quantum electrodynamics for superconducting electrical circuits: an architecture for quantum computation", arXiv:cond-mat/0402216v1 [cond-mat.mes-hall], Feb. 2008, 14 pages.
Blais, et al., "Quantum information processing with circuit quantum electrodynamics", arXiv:cond-mat/0612038v2, Jun. 1, 2007, 23 pgs.
Blais, Alexandre, et al., "Quantum-information processing with circuit quantum electrodynamics", Physical Review A 75, 032329 (2007), Mar. 22, 2007, 21 pgs.
Blume-Kohout, et al., "Robust, self-consistent, closed-form tomography of quantum logic gates on a trapped ion qubit", arXiv:1310.4492v1 [quant-ph], Oct. 16, 2013, 14 pgs.
Bombin, Hector, "Gauge Color Codes: Optimal Transversal Gates and Gauge Fixing in Topological Stabilizer Codes", arXiv:1311.0879v6 [quant-ph], Aug. 6, 2015, 10 pages.
Boyd, Stephen, et al., "Convex Optimization", Cambridge University Press, 2004, 730 pages.
Braumuller, Jochen, "Development of tunable transmon qubit in microstrip geometry", Karlsruhe Institute of Technology, Dec. 12, 2013, 96 pages.
Bylander, et al., "Dynamical decoupling and noise spectroscopy with a superconducting flux qubit", arXiv:1101.4707v1, Jan. 25, 2011, 21 pgs.
Caldwell, et al., "Parametrically-Activated Entangling Gates Using Transmon Qubits", arXiv:1706.06562v1, Jun. 20, 2017, 6 pgs.
Carr, et al., "Effects of Diffusion on Free Precession in Nuclear Magnetic Resonance Experiments*†", Phys. Rev. 94, 630, 1954, 13 pgs.
Chow, et al., "A simple all-microwave entangling gate for fixed-frequency superconducting qubits", arXiv:1106.0553v1, Jun. 3, 2011, 6 pgs.
Chow, et al., "Complete universal quantum gate set approaching fault-tolerant thresholds with superconducting qubits", arXiv:1202.5344v1, Feb. 23, 2012, 13 pgs.
Chow, et al., "Implementing a strand of a scalable fault-tolerant quantum computing fabric", Nature Communications 5, Jun. 24, 2014, 9 pgs.
Chow, et al., "Microwave-activated conditional-phase gate for superconducting qubits", New Journal of Physics 15, 115012, 2013, 11 pgs.

(56) References Cited

OTHER PUBLICATIONS

Chow, J., "Quantum Information Processing with Superconducting Qubits—Chapter 4.", Dissertation, Yale School of Engineering and Applied Sciences, May 2010, 39 pages.
Chow, et al., "Randomized Benchmarking and Process Tomography for Gate Errors in a Solid-State Qubit", Physical Review Letters 102, 090502, 2009, 4 pgs.
Chow, et al., "Universal quantum gate set approaching fault-tolerant thresholds with superconducting qubits", Phys. Rev.Lett. 109, Aug. 1-5, 2012, 5 pgs.
Chuang, et al., "Prescription for experimental determination of the dynamics of a quantum black box", Journal of Modern Optics 44, 2455, 1997, 13 pgs.
Chuang, et al., "Prescription for experimental determination of the dynamics of a quantum black box", arXiv:quant-ph/9610001v1, Oct. 1, 1996, 6 pgs.
Corcoles, et al., "Process verification of two-qubit quantum gates by randomized benchmarking", Physical Review A 87, 030301(R)(2013), Mar. 19, 2013, 4 pgs.
Cottet, "Implementation of a quantum bit in a superconducting circuit", PhD thesis, Université Paris IV, 2002, 259 pgs.
Devoret, et al., "Superconducting Circuits for Quantum Information: An Outlook", Science 339, 1169-74, Mar. 2013, 7 pgs.
Diamond, et al., "CVXPY: A Python-Embedded Modeling Language for Convex Optimization", Journal of Machine Learning Research 17, Jan. 2016, 5 pgs.
Dicarlo, L, et al., "Demonstration of two-qubit algorithms with a superconducting quantum processor", Nature, vol. 460, 240, Jul. 9, 2009, 5 pages.
Didier, et al., "Analytical modeling of parametrically-modulated transmon qubits", arXiv:1706.06566v1, Jun. 20, 2017, 10 pgs.
Didier, et al., "Fast Quantum Nondemolition Readout by Parametric Modulation of Longitudinal Qubit-Oscillator Interaction", Phys. Rev. Lett. 115, 203601, Nov. 2015, 5 pgs.
Didier, et al., "Fast quantum non-demolition readout from longitudinal qubit-oscillator interaction", arXiv:1504.04002v1, Apr. 15, 2015, 14 pgs.
Egger, D. J., et al., "Optimized controlled-Z gates for two superconducting qubits coupled through a resonator", Supercond. Sci. Technol. 27 (2014) 014001, Nov. 26, 2013, 12 pages.
Ekert, Artur, et al., "Geometric Quantum Computation", arXiv:quant-ph/004015v1, Feb. 1, 2008, 15 pages.
Flurin, "Superconducting Quantum Node for Entanglement and Storage of Microwave Radiation", arXiv:1401.5622v2, Feb. 4, 2015, 6 pgs.
Fowler, Austin G., "2D color code quantum computation", arXiv:0806.4827v3 [quant-ph], Jan. 10, 2011, 9 pages.
Fowler, Austin G., et al., "High threshold universal quantum computation on the surface code", arXiv:0803.0272v5, Physical Review A 80, 052312, Dec. 12, 2012, 20 pages.
Fowler, Austin G., "Surface codes: Towards practical large-scale quantum computation", Physical Review A 86, 032324, Sep. 18, 2012, 48 pages.
Ghosh, Joydip, et al., "High-fidelity controlled-σZ gate for resonator-based superconducting quantum computers", Physical Review A 87, 022309, Feb. 8, 2013, 19 pages.
Ghosh, et al, "Understanding the effects of leakage in superconducting quantum-error-detection circuits", Physical Review A 88, 062329, 2013, 7 pgs.
Havel, "Procedures for Converting among Lindblad, Kraus and Matrix Representations of Quantum Dynamical Semigroups", arXiv:quant-ph/0201127v4, Aug. 9, 2002, 32 pgs.
Havel, "Robust procedures for converting among Lindblad, Kraus and matrix representations of quantum dynamical semigroups", Journal of Mathematical Physics, vol. 44, No. 2, p. 534, Feb. 2003, 24 pgs.
Niskanen, et al., "Tunable coupling scheme for flux qubits at the optimal point", arXiv:cond-mat/0512238v2 [cond-mat.mes-hall], Jan. 24, 2006, 8 pgs.
OI, "Interference of Quantum Channels", arXiv:quant-ph/0303178v2, Apr. 14, 2003, 4 pgs.
OI, "Interference of Quantum Channels", Phys. Rev. Lett. 91, 067902, Aug. 2003, 4 pgs.
O'Malley, et al., "Qubit Metrology of Ultralow Phase Noise Using Randomized Benchmarking", Phys. Rev. Applied 3, 044009, 2015, 11 pgs.
O'Malley, et al., "Qubit Metrology of Ultralow Phase Noise Using Randomized Benchmarking", arXiv:1411.2613v3, Apr. 16, 2015, 11 pgs.
O'Malley, et al., "Scalable Quantum Simulation of Molecular Energies", Phys. Rev. X 6, 031007, 2016, 13 pgs.
O'Malley, et al., "Scalable Quantum Simulation of Molecular Energies", arXiv:1512.06860v2, Feb. 4, 2017, 13 pgs.
Paik, Hanhee, et al., "Observation of High Coherence in Josephson Junction Qubits Measured in a Three-Dimensional Circuit QED Architecture", Physical Review Letters 107, 240501, Dec. 5, 2011, 5 pages.
Poletto, et al., "Entanglement of two superconducting qubits in a waveguide cavity via monochromatic two-photon excitation", Phys. Rev.Lett. 109, 240505, Dec. 2012, 5 pgs.
Poletto, et al., "Entanglement of two superconducting qubits in a waveguide cavity via monochromatic two-photon excitation", arXiv:1208.1287v2, Nov. 12, 2012, 9 pgs.
Poyatos, et al., "Complete Characterization of a Quantum Process: The Two-Bit Quantum Gate", Phys. Rev. Lett. 78,390, Jan. 13, 1997, 4 pgs.
Poyatos, et al., "Complete Characterization of a Quantum Process: the Two-Bit Quantum Gate", arXiv:quant-ph/9611013v1, Nov. 10, 1996, 4 pgs.
Reagor, et al., "Demonstration of Universal Parametric Entangling Gates on a Multi-Qubit Lattice", arXiv:1706.06570v3 [quant-ph], Feb. 27, 2018, 17 pgs.
Reagor, et al., "Demonstration of Universal Parametric Entangling Gates on a Multi-Qubit Lattice", arXiv:1706.06570v2 [quant-ph], Jul. 13, 2017, 7 pgs.
Reagor, et al., "Demonstration of Universal Parametric Entangling Gates on a Multi-Qubit Lattice", arXiv:1706.06570v1 [quant-ph], Jun. 20, 2017, 7 pgs.
Reed, Matthew D., "Entanglement and Quantum Error Correction with Superconducting Qubits", arXiv:1311.6759v1, Nov. 26, 2013, 368 pgs.
Ribeiro, "Systematic Magnus-Based Approach for Suppressing Leakage and Nonadiabatic Errors in Quantum Dynamics", Physical Review X 7, 011021, Feb. 22, 2017, 24 pgs.
Richer, Susanne, "Perturbative analysis of two-qubit gates on transmon qubits", Thesis, RWTH Aachen University, Sep. 2013, 70 pages.
Rigetti, et al., "Fully microwave-tunable universal gates in superconducting qubits with linear couplings and fixed ransition frequencies", PhysRevB.81.134507, Apr. 5, 2010, 7 pgs.
Rigetti, et al., "Protocol for Universal Gates in Optimally Biased Superconducting Qubits", Phys.Rev.Lett.94.240502, Jun. 22, 2005, 4 pgs.
Rigetti, Chad Tyler, "Quantum Gates for Superconducting Qubits", Section 5; Dissertation—Yale University, May 2009, 46 pages.
Rigetti, et al., "Superconducting qubit in a waveguide cavity with a coherence time approaching 0.1 ms", Physical Review B 86, 100506(R), 2012, 5 pgs.
Rigetti, et al., "Superconducting qubit in a waveguide cavity with a coherence time approaching 0.1 ms", arXiv:1202.5533v1, Feb. 24, 2012, 4 pgs.
Riste, et al., "Demonstration of quantum advantage in machine learning", Nature Partner Journals, Quantum Information, www.nature.com/npjqi, Apr. 13, 2017, 5 pgs.
Riste, et al., "Demonstration of quantum advantage in machine learning", arXiv:1512.06069v1, Dec. 18, 2015, 12 pgs.
Rosenberg, et al., "3D integrated superconducting qubits", arXiv:1706.04116v1 [quant-ph], Jun. 13, 2017, 6 pgs.
Rosenberg, et al., "3D integrated superconducting qubits", arXiv:1706.04116v2 [quant-ph], Jun. 19, 2017, 6 pgs.

(56) References Cited

OTHER PUBLICATIONS

Roushan, et al., "Chiral ground-state currents of interacting photons in a synthetic magnetic field", arXiv:1606.00077v3 [quant-ph], Nov. 7, 2016, 16 pgs.
Roushan, et al., "Chiral ground-state currents of interacting photons in a synthetic magnetic field", nature physics, DOI: 10.1038/NPHYS3930, Oct. 31, 2016, 6 pgs.
Roy, et al., "Implementation of Pairwise Lognitudinal Coupling in a Three-Qubit Superconducting Circuit", Phys. Rev. Applied 7, 054025, May 30, 2017, 15 pgs.
Roy, et al., "Implementation of Pairwise Lognitudinal Coupling in a Three-Qubit Superconducting Circuit", arXiv:1610.07915v1 [quant-ph], Oct. 25, 2016, 16 pgs.
Roy, et al., "Introduction to parametric amplification of quantum signals with Josephson circuits", Comptes Rendus Physique 17, 740, 2016, 16 pgs.
Royer, et al., "Fast and High-Fidelity Entangling Gate through Parametrically Modulated Logitudinal Coupling", arXiv:1603.04424v3 [quant-ph], May 9, 2017, 15 pgs.
Ryan, et al., "Randomized benchmarking of single- and multi-qubit control in liquid-state NMR quantum information Processing", New Journal of Physics 11, 013034, 2009, 19 pgs.
Ryan, et al., "Tomography via correlation of noisy measurement records", Phys. Rev. A 91, 022118, 2015, 7 pgs.
Ryan, et al., "Tomography via correlation of noisy measurement records", arXiv:1310.6448v3 [quant-ph], Dec. 20, 2013, 7 pgs.
Schuch, et al., "Natural two-qubit gate for quantum computation using the XY interaction", Phys. Rev. A 67, 032301, 2003, 8 pgs.
Schuch, et al., "Natural two-qubit gate for quantum computation using the XY interaction", arXiv:quant-ph/0209035v2, Apr. 4, 2003, 8 pgs.
Schuster, David Isaac, "Circuit Quantum Electrodynamics", Dissertation presented to the faculty of the graduate school, Yale University, May 1, 2007, 255 pages.
Schutjens, et al., "Single qubit gates in frequency-crowded transmon systems", arXiv:1306.2279v1 [quant-ph], Jun. 10, 2013, 9 pgs.
Schutjens, et al., "Single-qubit gates in frequency-crowded transmon systems", Physical Review A 88, 052330, 2013, 8 pgs.
Sete, et al., "Charge- and Flux-Insensitive Tunable Superconducting Qubit", arXiv:1703.04613v3 [quant-ph], Aug. 7, 2017, 7 pgs.
Sete, et al., "Charge- and Flux-Insensitive Tunable Superconducting Qubit", Phys. Rev. Applied 8, 024004, Aug. 7, 2017, 8 pgs.
Sete, et al., "Flatsonium: Charge and flux insensitive tunable superconducting qubit", arXiv:1703.046132v2 [quant-ph], Mar. 21, 2017, 5 pgs.
Sheldon, et al., "Procedure for systematically tuning up crosstalk in the cross resonance gate", Phys. Rev. A 93, 060302, Mar. 15, 2016, 5 pgs.
Sheldon, et al., "Procedure for systematically tuning up crosstalk in the cross resonance gate", arXiv:1603.04821v1 [quant-ph], Mar. 15, 2016, 6 pgs.
Song, "10-qubit entanglement and parallel logic operations with a superconducting circuit", arXiv:1703.10302v1 [quant-ph], Mar. 30, 2017, 14 pgs.
Song, "10-qubit entanglement and parallel logic operations with a superconducting circuit", arXiv:1703.10302v2, Nov. 5, 2017, 16 pgs.
Strand, J. D., et al., "First-order sideband transitions with flux-driven asymmetric transmon qubits", Physical Review. B, Condensed Matter and Materials Physics, vol. 87, No. 22, Jun. 1, 2013 (Jun. 1, 2013), XP055366364, US, ISSN: 1098-0121, DOI: 10.1103/PhysRevB.87.220505, Jun. 7, 2013, 5 pages.
Strauch, Frederick W., et al., "Quantum Logic Gates for Coupled Superconducting Phase Qubits", Physical Review Letters, vol. 91, No. 16, Oct. 16, 2003, 4 pages.
Salathe, et al., "Digital Quantum Simulation of Spin Models with Circuit Quantum Electrodynamics", Phys. Rev. X 5, 021027, 2015.

\* cited by examiner

ANCILLA QUBIT DEVICES IN A SUPERCONDUCTING QUANTUM PROCESSOR

CROSS-REFERENCE TO RELATED APPLICATIONS

This application claims priority to U.S. Provisional Application Ser. No. 62/569,104 entitled "Ancilla Qubit Devices in a Superconducting Quantum Processor" and filed on Oct. 6, 2017. The priority application is incorporated herein by reference.

BACKGROUND

The following description relates to ancilla qubit devices in a superconducting quantum processor. In some quantum computing architectures, qubits are implemented in microwave integrated circuits. For example, qubits can be implemented in circuit devices that include Josephson junctions formed on a substrate.

DETAILED DESCRIPTION

Figure 1:
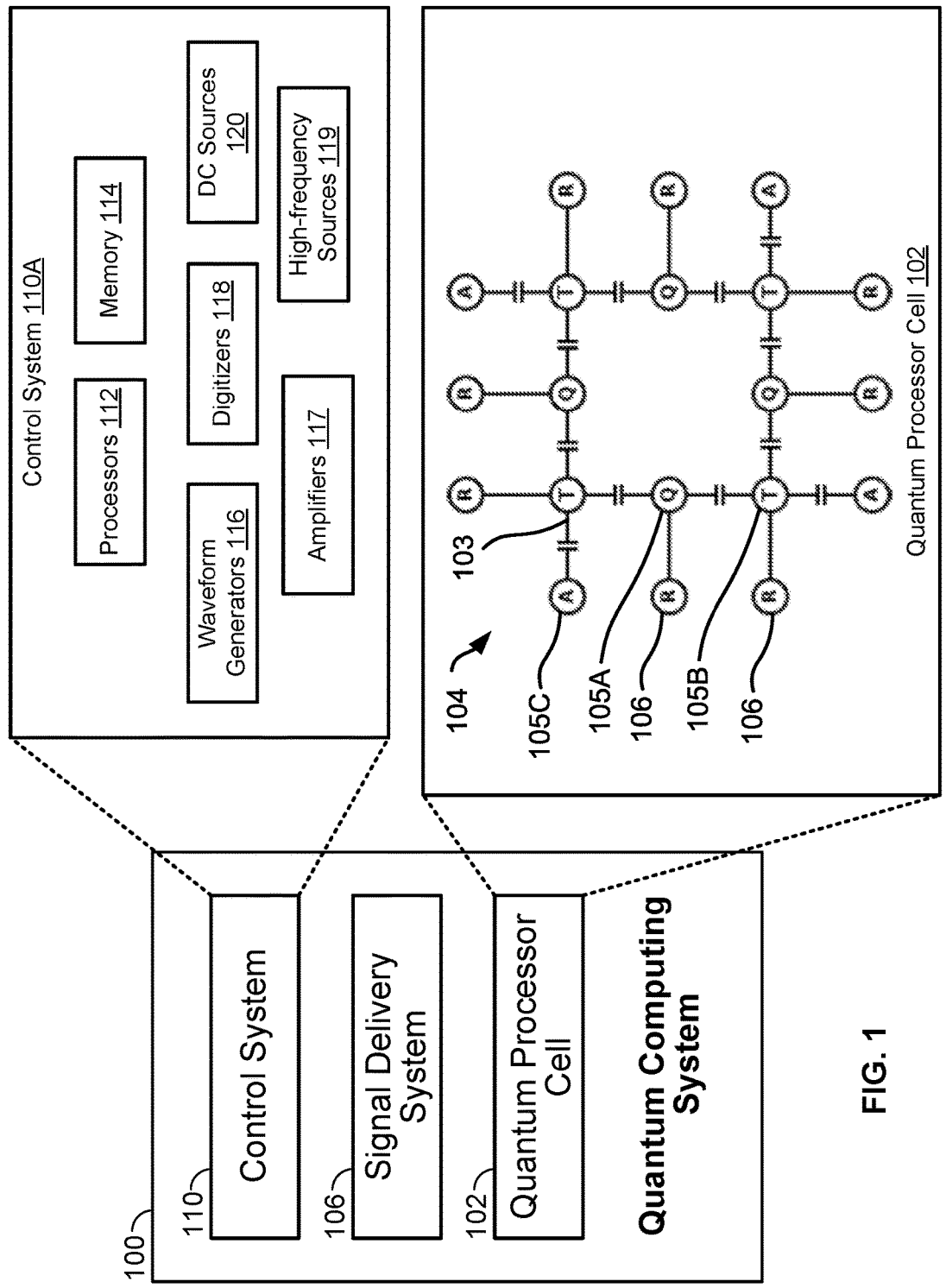
FIG. 1 is a block diagram of an example quantum computing system.

In some aspects of what is described here, an integrated circuit in a quantum processor includes ancilla qubit devices. In some instances, for example, a superconducting integrated circuit includes a fixed-frequency ancilla qubit device capacitively coupled to a tunable-frequency primary qubit device. A resonator device may be coupled to the tunable-frequency qubit device, while the ancilla qubit device may be coupled to the tunable-frequency qubit device only (e.g., not coupled to a resonator device, readout cavity, control line, or other type of component of the quantum processor device). In some implementations, the tunable-frequency primary qubit device can be used to transfer information (e.g., quantum states) into and out of the fixed-frequency ancilla qubit device. For example, the ancilla qubit device may be controlled via control signals sent to the primary qubit device (e.g., through a readout device, such as a resonator device).

The ancilla qubit devices may be engineered to have only some of the functionality or capabilities of the primary qubit devices in an integrated quantum circuit. For example, an ancilla qubit device may be implemented with or without coherent control elements (e.g., without a flux-bias line) or capabilities (e.g., without full control over the qubit space), with or without a dedicated readout resonator, or with or without external connections or connections to more than one other device in the integrated quantum circuit. In some cases, an ancilla qubit device can be implemented as a resonator device (e.g., a harmonic resonator device similar to a readout resonator), which may mitigate unwanted interactions while limiting the control capabilities. In some cases, an ancilla qubit device can be implemented as a transmon qubit device or another type of anharmonic qubit device, and the ancilla qubit device may or may not be connected to a dedicated readout device. The example quantum integrated circuit systems in FIGS. 1-4 show example ancilla qubit devices that are not directly connected to a dedicated readout device, but these examples may be modified to include dedicated readout devices directly connected to one or more of the ancilla qubit devices.

In some instances, an ancilla qubit device is used as a memory node in a quantum processor device, where the ancilla qubit device is used to store information used in a quantum algorithm (e.g., input data, output data, intermediate data of an algorithm). In some implementations, ancilla qubit devices that are used as memory qubits are directly connected to respective readout resonators so that the state of each memory qubit can be directly read, but do not need dedicated coherent control elements.

In some instances, ancilla qubit devices are used as a "scratch pad register" for use in quantum algorithms, which may reduce consumption of other qubit devices with control or measurement signals transferred through the resonator (or other) device. In some implementations, ancilla qubit devices that are not connected to respective readout resonators can be used as scratch pad qubits, for example, when the states of scratch pad qubits would be used only internally (e.g. by other qubit devices) within the quantum integrated circuit.

In some instances, the ancilla qubit device is used as a computation node in a quantum processor device, where the ancilla qubit device is used in the implementation of a quantum algorithm (e.g., used in the implementation of a quantum logic gate on the quantum processor device). For example, an ancilla qubit device can be used in the implementation of a two-qubit interaction (e.g., two-gate operation) with one or more primary qubit devices.

The systems and techniques described here may provide one or more advantages in some instances. For example, the number of qubit devices available per readout signal line from the control system may be increased. The ratio of readout devices to qubit devices may accordingly be reduced, saving space on quantum circuit chips. In some aspects, two-qubit interactions may be performed without the complexity of having readout lines for every qubit device. For example, a two-qubit interaction between a primary qubit device and an ancilla qubit device may be controlled by a single control signal sent to the primary qubit device. As a specific example, the primary qubit device can be implemented as a flux-tunable transmon qubit device, the ancilla qubit device can be implemented as a fixed-frequency transmon qubit device, and parametrically-activated gates can be used (e.g., as described in the publication "Parametrically-Activated Entangling Gates Using Transmon Qubits" by S. Caldwell et al., dated Jun. 20, 2017 at https://arxiv.org/pdf/1706.06562v1.pdf, which is hereby incorporated by reference) to control interactions between the ancilla qubit device and primary qubit device. Further, in some instances, one or more ancilla qubit devices may be used as on-chip memories (memory on the same chip as the quantum processor), which can be useful for many quantum programs or algorithms and may allow for greater scalability of the quantum processor device.

FIG. 1 is a schematic diagram of an example quantum computing system 100. The example quantum computing system 100 shown in FIG. 1 includes a control system 110, a signal delivery system 106, and a quantum processor cell 102. A quantum computing system may include additional or different features, and the components of a quantum computing system may operate as described with respect to FIG. 1 or in another manner.

The example quantum computing system 100 shown in FIG. 1 can perform quantum computational tasks by executing quantum algorithms. In some implementations, the quantum computing system 100 can perform quantum computation by storing and manipulating information within individual quantum states of a composite quantum system. For example, qubits (i.e., quantum bits) can be stored in and represented by an effective two-level sub-manifold of a quantum coherent physical system. In some instances, quantum logic can be executed in a manner that allows large-scale entanglement within the quantum system. Control signals can manipulate the quantum states of individual qubits and the joint states of multiple qubits. In some instances, information can be read out from the composite quantum system by measuring the quantum states of the qubits.

In some implementations, the quantum computing system 100 can operate using gate-based models for quantum computing. For example, the qubits can be initialized in an initial state, and a quantum logic circuit comprised of a series of quantum logic gates can be applied to transform the qubits and extract measurements representing the output of the quantum computation. In some implementations, the quantum computing system 100 can operate using adiabatic models for quantum computing. For instance, the qubits can be initialized in an initial state, and the controlling Hamiltonian can be transformed adiabatically by adjusting control parameters to another state that can be measured to obtain an output of the quantum computation.

In some models, fault-tolerance can be achieved by applying a set of high-fidelity control and measurement operations to the qubits. For example, topological quantum error correction schemes can operate on a lattice of nearest-neighbor coupled qubits. In some instances, these and other types of quantum error correcting schemes can be adapted for a two- or three-dimensional lattice of nearest neighbor coupled qubits, for example, to achieve fault-tolerant quantum computation. Adjacent pairs of qubits in the lattice can be addressed, for example, with two-qubit logic operations that are capable of generating entanglement, independent of other pairs in the lattice. In some implementations, the quantum computing system 100 is constructed and operated according to a scalable quantum computing architecture. For example, in some cases, the architecture can be scaled to a large number of qubits to achieve large-scale general purpose coherent quantum computing.

In some instances, all or part of the quantum processor cell 102 functions as a quantum processor, a quantum memory, or another type of subsystem. In some examples, the quantum processor cell includes a quantum integrated circuit system, such as, for example, the quantum integrated circuit systems shown in FIGS. 1, 2, 3, 4, or another type of quantum integrated circuit system. The quantum integrated circuit system may include qubit devices, resonator devices, and possibly other devices that are used to store and process quantum information. In some cases, the quantum integrated circuit system is a superconducting circuit, and the qubit devices are implemented as circuit devices that include Josephson junctions, for example, in superconducting quantum interference device (SQUID) loops or other arrangements, and are controlled by radio-frequency signals, microwave signals, and bias signals delivered to the quantum processor cell 102.

In some implementations, the example quantum processor cell 102 can process quantum information by applying control signals to the qubit devices housed in the quantum processor cell 102. The control signals can be configured to encode information in the qubit devices, to process the information by performing quantum logic gates or other types of operations, or to extract information from the qubit devices. In some examples, the operations can be expressed as single-qubit logic gates, two-qubit logic gates, or other types of quantum logic gates that operate on one or more qubits. A sequence of quantum logic operations can be applied to the qubits to perform a quantum algorithm. The quantum algorithm may correspond to a computational task, a quantum error correction procedure, a quantum state distillation procedure, or a combination of these and other types of operations.

In the example shown, the quantum processor cell 102 includes a quantum integrated circuit system 104. The example quantum integrated circuit system 104 is a superconducting circuit that includes qubit devices 105A, 105B, 105C and resonator devices 106 arranged in a two-dimensional device array. The qubit devices each store a single qubit of information. In some cases, the resonator devices 106 may be configured to generate readout signals that indicate the computational states of the respective qubit devices to which they are connected. In some examples, the quantum processor cell 102 includes coupler devices that selectively operate on individual qubits or pairs of qubits. For example, the coupler devices may produce entanglement or other multi-qubit states over two or more qubits. The superconducting quantum circuit system 104 may include additional devices (e.g., additional qubit devices, coupler devices and other types of devices), or additional quantum processor cells 102.

Some or all of the qubits collectively can represent the computational state of a quantum processor, a quantum memory or both. In some examples, a first subset of the qubit devices (e.g., the fixed-frequency primary qubit devices 105A, and the tunable-frequency primary qubit devices 105B) represent the computational state of a quantum processor, while a second subset of the qubit devices (e.g., the fixed-frequency ancilla qubit devices 105C) represent the computational state of a quantum memory. The quantum memory can be used to store information while the quantum processor performs computations. The quantum processor can operate the first subset of qubit devices as compute nodes and access the second subset of qubit device as storage nodes (e.g., for intermediate values or computations).

In the example shown in FIG. 1, the quantum processor cell 102 includes three different types of qubit devices—fixed-frequency primary qubit devices 105A (designated with a "Q" in the example shown), tunable-frequency primary qubit devices 105B (designated with a "T" in the example shown), and fixed-frequency ancilla qubit devices 105C (designated with an "A" in the example shown). Each qubit device 105A, 105B, 105C defines a transition frequency between the two quantum states (e.g., a ground state and first excited state) of an individual qubit.

The transition frequencies of the example fixed-frequency primary qubit devices 105A and fixed-frequency ancilla qubit devices 105C are not tunable by application of an offset field and are independent of magnetic flux experienced by the qubit device. For instance, a fixed-frequency qubit device may have a fixed transition frequency that is defined by an electronic circuit of the qubit device. As an example, a superconducting qubit device (e.g., a fixed-frequency transmon qubit or another type of fixed-frequency qubit devices) may be implemented without a SQUID loop. In some examples, a fixed-frequency qubit device includes a single Josephson junction, and the transition frequency of the fixed-frequency qubit device is defined at least in part by a Josephson energy of the Josephson junction (independent of a magnetic flux experienced by the fixed-frequency qubit device). Although shown as fixed-frequency qubit devices in FIG. 1, one or more of the qubit devices 105A, 105C may be implemented as tunable-frequency qubit devices in some instances.

The transition frequencies of the example tunable-frequency qubit devices 105B are tunable, for example, by application of an offset field. For instance, a tunable qubit device may include a superconducting loop (e.g., a SQUID loop) that is tunable by application of magnetic flux. In some examples, the tunable qubit devices are implemented as tunable transmon qubit devices, flux qubit devices, flatsonium qubit devices, fluxonium qubit devices, or other types of tunable devices. In some examples, a tunable qubit device includes a superconducting circuit loop that receives a magnetic flux that tunes the transition frequency of the tunable qubit device. As an example, the superconducting circuit loop may include two Josephson junctions, and the tunable qubit device may also include a capacitor structure in parallel with each of the two Josephson junctions. The transition frequency of the tunable qubit device may be defined at least in part by Josephson energies of the two Josephson junctions, a capacitance of the capacitor structure and a magnetic flux threading the superconducting circuit loop. For example, the magnetic flux $\Phi(t)$ through the SQUID loop can be modified in order to tune the transition frequency of the qubit device. In some cases, an inductor or other type of flux-bias device is coupled to the SQUID loop by a mutual inductance, and the magnetic flux $\Phi(t)$ through the SQUID loop can be controlled by the current through the inductor. In some cases, a coupling strength can be controlled by both AC and DC components of the current.

In some instances, the tunable-frequency qubit devices 105B can be selectively activated by an offset field that does not directly affect the information encoded in the fixed-frequency qubit devices 105A, 105C. For instance, although the offset field may cause a tunable-frequency qubit device to interact with one of the fixed-frequency qubit devices, the offset field does not modify the transition frequencies of the other fixed-frequency qubit devices (even if the fixed-frequency qubit devices experience the offset field). In this manner, the combination of tunable qubit devices with fixed-frequency qubit devices may allow selective, on-demand coupling of qubit devices while improving performance of the qubit devices. For example, the qubit devices may have longer coherence times, may be more robust against environmental or applied offset fields, etc.

The example superconducting quantum circuit system 104 includes eight (8) primary qubit devices (four fixed-frequency qubit devices 105A and four tunable-frequency qubit devices 105B) and four fixed-frequency ancilla qubit devices 105C. In the example shown, each primary qubit device is coupled to a resonator device 106. The resonator devices 106 may be used, in some instances, as a readout device in the quantum circuit system 104. For example, the resonator devices 106 may receive signals that cause the resonator devices 106 to selectively interact with the qubit devices to detect their quantum states. The resonator devices 106 may provide readout response signals that indicate the computational state of the quantum processor or quantum memory. In some implementations, the resonator devices 106 are implemented as described in International Publication Number WO2017/007446, published Jan. 12, 2017 and entitled "Lumped-Element Device for Quantum Information Processing Systems." The resonator devices 106 may be implemented in another manner.

In the example shown, each ancilla qubit device 105C is coupled to one of the tunable-frequency primary qubit devices 105B. In some instances, the ancilla qubit devices 105C are used as memory nodes in the quantum circuit system 104. For example, the quantum circuit system 104 may implement a quantum algorithm using one or more of the tunable-frequency primary qubit devices 105B. The quantum algorithm may generate intermediate data (e.g., data not included in the output of the algorithm, such as a counter value) in the tunable-frequency primary qubit devices 105B and store the data in the ancilla qubit device 105C that is coupled to the primary qubit device 105B such that the data may be accessed later by the primary qubit device 105B or another device in the quantum circuit system 104. In some instances, the ancilla qubit devices 105C are used as computation nodes in the quantum circuit system 104. For example, the ancilla qubit devices 105C may be used along with the primary qubit devices 105B in the implementation of a quantum logic gate. The ancilla qubit devices 105C may be controlled via control signals sent to the primary qubit devices 105B by the resonator devices 106. For example, a control signal may transfer information in the primary qubit device 105B to the ancilla qubit device 105C. As another example, a control signal may use the primary qubit device 105B and the ancilla qubit device 105C in the implementation of another type of quantum logic gate.

The example quantum circuit system 104 also includes connections 103 between neighboring pairs of the qubit devices 105A, 105B, 105C. The connections 103 can provide electromagnetic communication between the connected circuit devices. In the example shown, the connections 103 are implemented as capacitive connections. In some cases, however, the connections 103 are implemented as conductive connections. For instance, the connections 103 may include metal traces, capacitors, bonds and other components. The qubit devices 105A, 105B, 105C may be operated by microwave signals delivered in the quantum circuit system 104 (e.g., through the resonator devices 106), for example, from the control system 110. Signals may be exchanged among the qubit devices 105A, 105B, 105C through the connections 103 or other signal pathways in the quantum circuit system 104.

In the example shown, the signal delivery system 106 provides communication between the control system 110 and the quantum processor cell 102. For example, the signal delivery system 106 can receive control signals from the control system 110 and deliver the control signals to the quantum processor cell 102. In some instances, the signal delivery system 106 performs preprocessing, signal conditioning, or other operations to the control signals before delivering them to the quantum processor cell 102. In some instances, the signal delivery system 106 receives qubit readout signals from the quantum processor cell and delivers the qubit readout signals to the control system 110. In some instances, the signal delivery system 106 performs preprocessing, signal conditioning or other operations on the readout signals before delivering them to the control system 110. In some implementations, the signal delivery system 106 includes input and output processing hardware, input and output connections, and other components. The input and processing hardware may include, for example, filters, attenuators, directional couplers, multiplexers, diplexers, bias components, signal channels, isolators, amplifiers, power dividers and other types of components.

In some implementations, the signal delivery system 106 and the quantum processor cell (QPC) 102 are maintained in a controlled QPC environment. The QPC environment can be provided, for example, by shielding equipment, cryogenic equipment, and other types of environmental control systems. In some examples, the components in the QPC environment operate in a cryogenic temperature regime and are subject to very low electromagnetic and thermal noise. For example, magnetic shielding can be used to shield the system components from stray magnetic fields, optical shielding can be used to shield the system components from optical noise, thermal shielding and cryogenic equipment can be used to maintain the system components at controlled temperature, etc. The levels and types of noise that are tolerated or controlled in the QPC environment can vary, for example, based on the features and operational requirements of the quantum processor cell 102 and the signal delivery system 106.

In the example quantum computing system 100 shown, the control system 110 controls operation of the quantum processor cell 102. The example control system 110 may include data processors, signal generators, interface components and other types of systems or subsystems. In some cases, the control system 110 includes one or more classical computers or classical computing components.

The example control system 110 includes processors 112, memory 114, waveform generators 116, amplifiers 117, digitizers 118, high-frequency sources 119 and DC sources 120. A control system may include additional or different features and components. In some examples, components of the control system 110 operate in a room temperature regime, an intermediate temperature regime, or both. For example, the control system 110 can be configured to operate at much higher temperatures and be subject to much higher levels of noise than are present in the QPC environment.

In some implementations, the control system 110 includes a classical computing cluster, servers, databases, networks, or other types of classical computing equipment. For instance, the memory 114 can include, for example, a random access memory (RAM), a storage device (e.g., a read-only memory (ROM) or others), a hard disk, or another type of storage medium. The memory 114 can include various forms of memory, media and memory devices, including by way of example semiconductor memory devices (e.g., EPROM, EEPROM, flash memory devices, and others), magnetic disks (e.g., internal hard disks, removable disks, and others), magneto optical disks, and CD ROM and DVD-ROM disks. The processors 112 may include one or more single- or multi-core microprocessors, one or more FPGAs or ASICs, one or more other types of data processing apparatus.

In the example shown, the waveform generators 116 and the DC sources 120 can each generate control signals based on control information provided by the processors 112. The control signals can be delivered to the quantum processor cell 102 by the signal delivery system 106, for example, and interact with the qubit devices 105A, 105B. In the example shown, the digitizers 118 can receive and process signals from the quantum processor cell 102. For example, the received signals can be mixed with reference signals from the high-frequency sources 119 and digitized by digitizers 118. The digitizers 118 and other processing hardware can process (e.g., digitize, or otherwise process) the signals from the quantum processor cell 102 and provide the processed information to the processors 112. The processors 112 can extract data, for example, to identify the quantum states of qubits in the quantum processor cell 102 or for other purposes.

Figure 2:
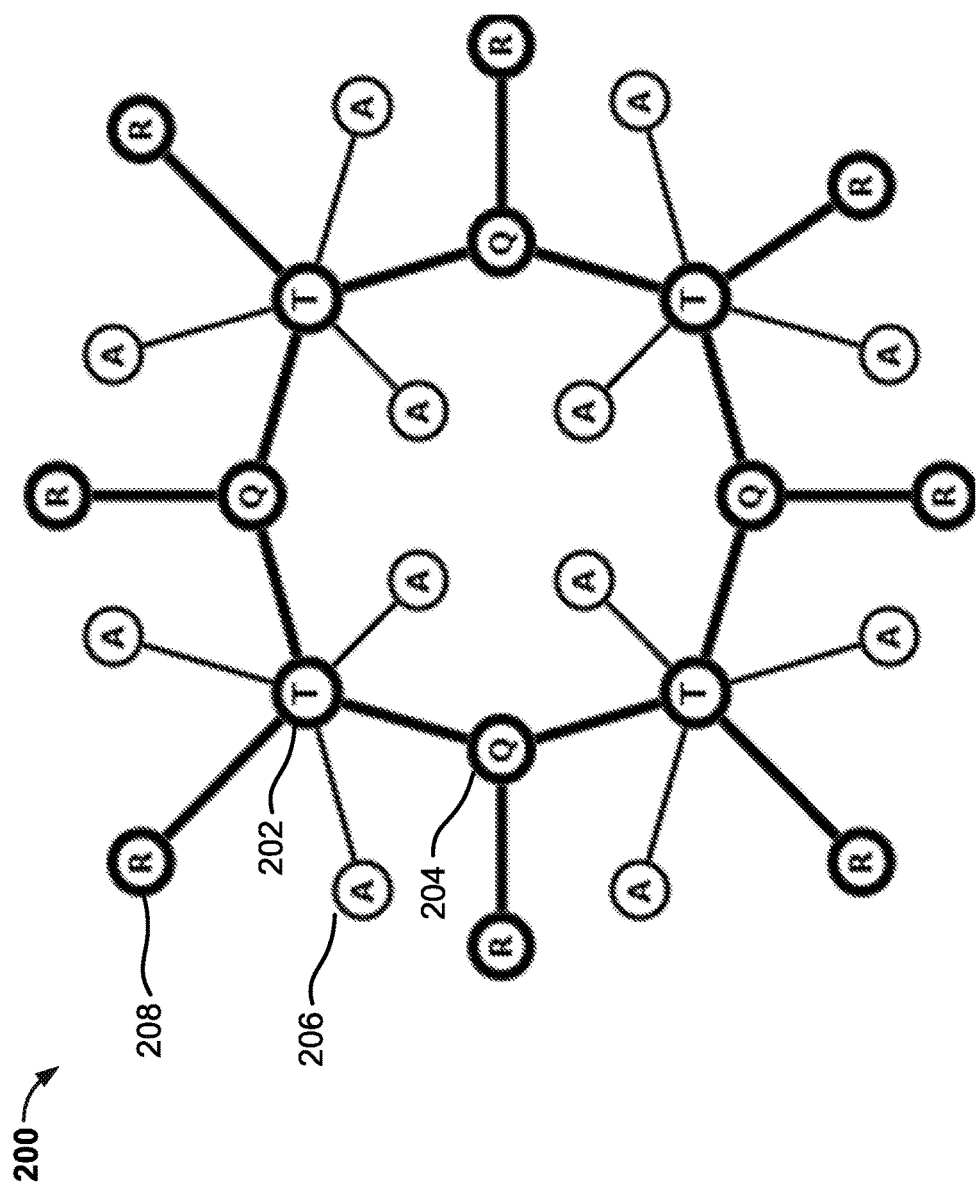
FIG. 2 is a diagram of an example quantum integrated circuit system.

FIG. 2 is a diagram of another example quantum integrated circuit system 200. The quantum integrated circuit system 200 shown in FIG. 2 may represent a portion of a larger quantum circuit system that includes additional components. In some cases, the quantum integrated circuit system 200 is implemented as a superconducting circuit in a quantum processor (e.g., in the quantum processor cell 102 shown in FIG. 1).

The example system 200 includes multiple tunable-frequency primary qubit devices 202 connected to fixed-frequency primary qubit devices 204 and fixed-frequency ancilla qubit devices 204. Like the example quantum circuit system 104 of FIG. 1, the example system 200 includes eight (8) primary qubit devices (four fixed-frequency qubit devices 204 and four tunable-frequency qubit devices 202). However, the example system 200 includes three fixed-frequency ancilla qubit devices 206 connected to each tunable-frequency primary qubit device 202. In the example shown, each tunable-frequency primary qubit device 202 and fixed-frequency primary qubit device 204 is connected to a resonator device 208, but the fixed-frequency ancilla qubit devices 206 are not directly connected to a resonator device 208. Although shown as fixed-frequency qubit devices in FIG. 2, one or more of the qubit devices 204, 206 may be tunable-frequency qubit devices in some instances.

The components of the example system 200 may be connected by capacitive or conductive connections. For instance, the connections between the various components may include metal traces, capacitors, bonds, or other components. In the example shown, the fixed-frequency primary qubit devices 204 and fixed-frequency ancilla qubit devices 206 are connected to the tunable-frequency primary qubit devices 202 with approximately 60 degrees of separation between respective connections. The qubit devices may be arranged in another layout, for example, with devices separated by angles in the range of 50-70 degrees, or 40-80 degrees.

The qubit devices 202, 204, 206 may be operated by microwave signals delivered in the system 200, for example, from a control system (e.g., a control system similar to control system 110 of FIG. 1). For example, control or readout signals may be sent to the primary qubit devices 202, 204 through the resonator devices 208. In some instances, the ancilla qubit devices 206 may be controlled by control signals sent to the primary qubit device 202 to which it is connected, allowing for a reduced amount or ratio of readout devices necessary to control the qubit devices. For instance, in the example shown in FIG. 2, all twenty qubit devices 202, 204, 206 may be operated with only eight readout signals or readout-flux-line signals sent through the respective resonator devices 208.

Figure 3:
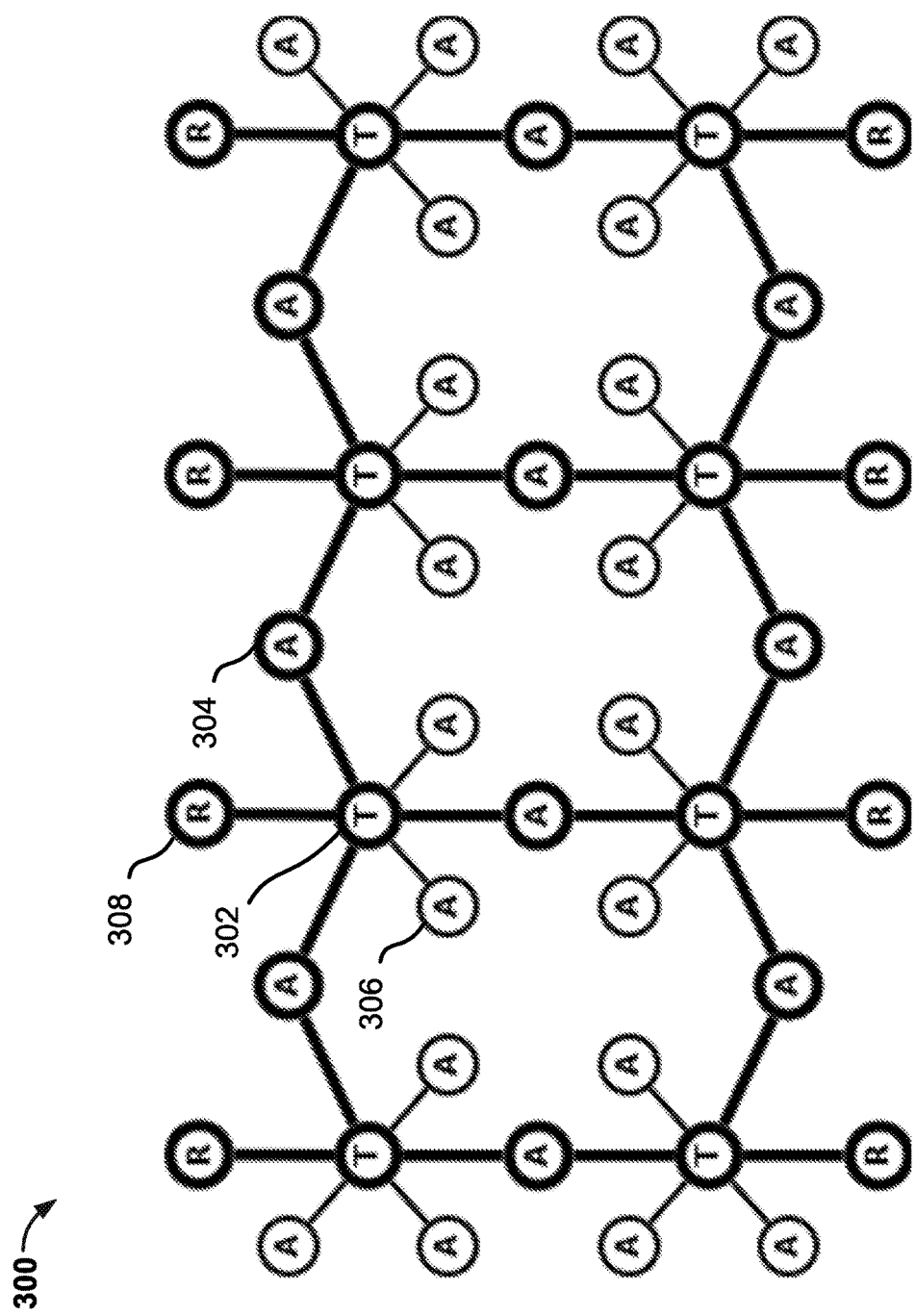
FIG. 3 is a diagram of another example quantum integrated circuit system.

FIG. 3 is a diagram of another example quantum integrated circuit system 300. The quantum integrated circuit system 300 shown in FIG. 3 may represent a portion of a larger quantum circuit system that includes additional components. In some cases, the quantum integrated circuit system 300 is implemented as a superconducting circuit in a quantum processor (e.g., in the quantum processor cell 102 shown in FIG. 1).

The example system 300 includes multiple tunable-frequency primary qubit devices 302 connected to fixed-frequency ancilla qubit devices 304, 306. In the example shown, there are eight (8) primary qubit devices 302, ten

(10) interconnect ancilla qubit devices 304, and twenty (20) memory ancilla qubit devices 306. Each primary qubit device 302 is connected to two interconnect ancilla qubit devices 304, and two or three memory ancilla qubit devices 306 (the four primary qubit devices in the corners have three memory ancilla qubit devices connected thereto, while the four primary qubit devices in the interior have two memory ancilla qubit devices connected thereto). Further, each tunable-frequency primary qubit device 302 is connected to a resonator device 308, and none of the ancilla qubit devices 304, 306 are directly connected to a resonator device 308. Although shown as fixed-frequency qubit devices in FIG. 3, one or more of the ancilla qubit devices 304, 306 may be tunable-frequency qubit devices in some instances. In some implementations, the architecture shown in FIG. 3 can be extended to a total of 92 qubits where 20 readout-flux-line signals are provided to the chip (e.g., through twenty resonator devices 308).

The components of the example system 300 may be connected by capacitive or conductive connections. For instance, the connections between the various components may include metal traces, capacitors, bonds, or other components. In the example shown, the qubit devices 302, 304, 306 are connected with approximately 60 degrees of separation between respective connections. The qubit devices may be arranged in another layout, for example, with devices separated by angles in the range of 50-70 degrees, or 40-80 degrees.

The qubit devices 302, 304, 306 may be operated by microwave signals delivered in the system 300, for example, from a control system (e.g., a control system similar to control system 110 of FIG. 1). For example, control or readout signals may be sent to the primary qubit devices 302 through the resonator devices 308. In some instances, the ancilla qubit devices 304, 306 may be controlled by control signals sent to the primary qubit device 302 to which it is attached. For instance, a control signal sent to a primary qubit device 302 may control the primary qubit device 302 and an interconnect ancilla qubit device 304 to implement a quantum logic gate, or may control the memory ancilla qubit devices 306 to store information (e.g., intermediate data generated by a quantum algorithm executed on the system 300). In the example shown in FIG. 3, all thirty-eight qubit devices 302, 304, 306 may be controlled with only eight readout or readout-flux-line signals sent through the respective resonator devices 308.

Figure 4:
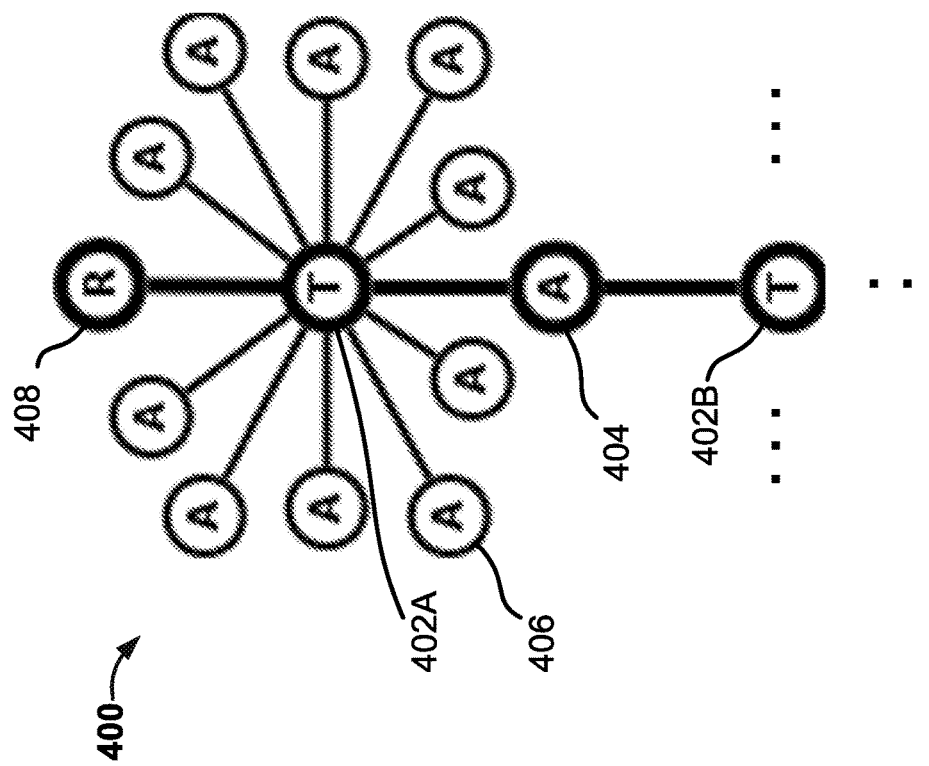
FIG. 4 is a diagram of another example quantum integrated circuit system.

FIG. 4 is a diagram of another example quantum integrated circuit system 400. The example system 400 shown in FIG. 4 can represent a portion of a larger quantum circuit system that includes additional components. For instance, in some implementations, the example system 400 can be included as a stub device in a quantum circuit system with additional qubit devices (e.g., the systems 200, 300 of FIGS. 2, 3). For example, the tunable-frequency primary qubit device 402B may be connected to other qubit devices, resonator devices, or another stub device like that shown in FIG. 4. In some cases, the quantum integrated circuit system 400 is implemented as a superconducting circuit in a quantum processor (e.g., in the quantum processor cell 102 shown in FIG. 1).

The example system 400 includes a tunable-frequency primary qubit device 402A connected to multiple ancilla qubit devices 404, 406 and a resonator device 408. None of the ancilla qubit devices 404, 406 is directly connected to a resonator device 408. In the example shown, the tunable-frequency primary qubit device 402A communicates with the tunable-frequency primary qubit device 402B through an interconnect ancilla qubit device 404, and utilizes the memory ancilla qubit devices 406 to store information (e.g., intermediate data generated during quantum algorithms). In some instances, the interconnect ancilla qubit 404 is used as a computation node. For example, a quantum logic gate may be implemented by the primary qubit device 402A and the interconnect qubit device 404 based on a control signal sent to the primary qubit device 402A through the resonator device 408.

The components of the example system 400 may be connected by capacitive or conductive connections. For instance, the connections between the components may include metal traces, capacitors, bonds, or other components. The qubit devices of the system 400 may be operated by microwave signals delivered in the system 200, for example, from a control system (e.g., a control system similar to control system 110 of FIG. 1). For example, control or readout signals may be sent to the primary qubit device 402 through the resonator device 408. In some instances, the primary qubit device 402A and the ancilla qubit devices attached thereto can be controlled with one readout or readout-flux-line signal sent through the one resonator device 408.

In a general aspect, a quantum computing system includes ancilla qubit devices.

In a first example, a quantum computing system includes a primary qubit device connected to a resonator device and one or more ancilla qubit devices. The ancilla qubit devices may be connected only to the primary qubit device. The primary qubit device may be a tunable-frequency qubit device, and the ancilla qubit devices may be fixed-frequency qubit devices. The quantum computing system may also include a fixed-frequency primary qubit device connected to the tunable-frequency qubit device. The tunable-frequency primary qubit device may be a transmon qubit device. The quantum computing system may include multiple primary qubit devices and one or more interconnect ancilla qubit devices, with each primary qubit device being connected to a resonator device and an interconnect ancilla qubit device. The one or more ancilla qubit devices may include interconnect ancilla qubit devices and memory ancilla qubit devices. The quantum computing system may include a control system configured to send control signals to the ancilla qubits through the resonator device.

In a second example, control signals are sent to a tunable-frequency primary qubit device. The control signals control an operation of an ancilla qubit device directly connected to the tunable-frequency primary qubit device. The control signals may control the ancilla qubit device to store information. The control signals may control the ancilla qubit device to perform, with the primary qubit device, quantum logic gates in a quantum algorithm. The control signals may implement a two-qubit quantum logic gate using one primary qubit device and the ancilla qubit device. The quantum state of the primary qubit device can be read out by operating a readout device connected directly to the primary qubit device. The quantum state of the ancilla qubit device can be read out by operating the same readout device and performing control operations on the primary qubit device.

In a third example, a quantum computing system includes a quantum processor cell that includes a superconducting quantum circuit system. The superconducting quantum circuit system includes a tunable-frequency primary qubit device; a flux-bias device coupled to the tunable-frequency primary qubit device; and a fixed-frequency ancilla qubit device. The fixed-frequency ancilla qubit device is connected only to the tunable-frequency primary qubit device in the superconducting quantum circuit system. Thus, the fixed-frequency ancilla qubit device does not have a direct connection to any circuit device other than the tunable-frequency primary qubit device. In the example shown in FIG. 2, the ancilla qubit device 206 is connected only to the tunable-frequency primary qubit device 202; in the example shown in FIG. 3, the ancilla qubit device 306 is connected only to the tunable-frequency primary qubit device 302; in the example shown in FIG. 4, the ancilla qubit device 406 is connected only to the primary qubit device 402A. The quantum computing system also includes a control system communicably coupled to the quantum processor cell. The control system is configured to apply a parametrically-activated two-qubit quantum logic gate to the tunable-frequency primary qubit device and the fixed-frequency ancilla qubit device by sending, to the flux-bias device, a radio-frequency control signal that modulates the tunable-frequency primary qubit device. For instance, the control signal can be a flux pulse (e.g., of the type described in the publication "Parametrically-Activated Entangling Gates Using Transmon Qubits" by S. Caldwell et al., dated Jun. 20, 2017 at https://arxiv.org/pdf/1706.06562v1.pdf) delivered on a flux-bias line.

Implementations of the third example may include one or more of the following features. The superconducting quantum circuit system may include a capacitive connection that connects the tunable-frequency primary qubit device to the fixed-frequency ancilla qubit device. The superconducting quantum circuit system does not include another direct connection to the fixed-frequency ancilla qubit device. The superconducting quantum circuit system may include a readout resonator device connected to the tunable-frequency primary qubit device. The control system can be configured to detect a quantum state of the tunable-frequency primary qubit device by sending a control signal to the tunable-frequency primary qubit device through the readout resonator device. The superconducting quantum circuit system may include at least one other qubit device connected to the tunable-frequency primary qubit device. The at least one other qubit device can include one or more ancilla qubit devices (e.g., memory ancilla qubit devices, interconnect ancilla qubit devices, or a combination of both), one or more primary qubit devices, or a combination of both. The flux-bias device can be an inductor that is inductively coupled to a circuit loop (e.g., a SQUID loop) defined by the tunable-frequency primary qubit device.

Implementations of the third example may include one or more of the following features. The parametrically-activated two-qubit quantum logic gate can be an iSWAP gate, a controlled-Z gate, or another type of gate. The parametrically-activated two-qubit quantum logic gate can be applied as part of a quantum logic circuit or another type of quantum computing process.

Implementations of the third example may include one or more of the following features. The control system can be configured to operate the fixed-frequency ancilla qubit device as a memory qubit device without a dedicated readout device connected to the fixed-frequency ancilla qubit device.

Implementations of the third example may include one or more of the following features. The control system can be configured to operate the fixed-frequency ancilla qubit device in an error correcting code. For example, the quantum computing system may apply a color code, a surface code, or another type of quantum error correcting code to detect and remove errors; and the ancilla qubit may be used, for instance, to detect an error syndrome (e.g., based on parity measurements or otherwise) in the application of the quantum error correcting code.

Implementations of the third example may include one or more of the following features. The control system can be configured to use the fixed-frequency ancilla qubit device to extend a quantum computational capacity of the quantum processor cell beyond the number of primary qubit devices in the quantum processor cell. For example, the quantum computational capacity of the quantum processor cell may be described, in some cases, as a coherent Hilbert space having a dimension $2^N$, where N is an integer that is larger than the number of primary qubit devices in the quantum processor cell. In such cases, a binary sampling of the Hilbert space can produce a bitstring of length N, even though the quantum processor cell has less than N primary qubit devices.

Implementations of the third example may include one or more of the following features. The control system can be configured to obtain a binary readout value by measuring a first qubit device in the quantum processor cell; and to store the binary readout value in the fixed-frequency ancilla qubit device. For example, the control system can obtain a classical binary value by projectively measuring the state of a qubit device in the quantum processor cell. The classical binary value can be stored in the ancilla qubit device, for instance, and then retrieved from the ancilla qubit device, accessed in a further control flow, or utilized in another manner.

Implementations of the third example may include one or more of the following features. The control system can store information in the quantum processor cell, for example, by encoding the information in the states of the qubit devices. The control system can then process the information, for example, by manipulating the states of the qubit devices. In some instances, the qubit devices are manipulated by applying the parametrically-activated two-qubit quantum logic gate. The control system can read out the states of the qubit devices, for example, using readout devices in the quantum processor cell.

Implementations of the third example may include one or more of the following features. The superconducting quantum circuit system may include multiple tunable-frequency primary qubit devices; flux-bias devices coupled to the respective tunable-frequency primary qubit devices; and multiple fixed-frequency ancilla qubit devices. In some cases, each fixed-frequency ancilla qubit device is connected only to a respective one of the tunable-frequency primary qubit devices. The superconducting quantum circuit system may include connections between neighboring pairs of primary and ancilla qubit devices, such that each neighboring pair includes one of the tunable-frequency primary qubit devices and one of the fixed-frequency ancilla qubit devices. The control system can be configured to apply parametrically-activated two-qubit quantum logic gates to the neighboring pairs by sending, to the flux-bias device coupled to the tunable-frequency primary qubit device in a respective neighboring pair, a radio-frequency control signal that modulates the tunable-frequency primary qubit device in the respective neighboring pair. The quantum processor cell may include additional qubit devices (e.g., interconnect ancilla qubit devices, fixed-frequency primary qubit devices, etc.), which may be interconnected with other devices in the superconducting quantum circuit system. The superconducting quantum circuit system may include additional connections between neighboring pairs of primary qubit devices, where each neighboring pair of primary qubit devices includes at least one of the tunable-frequency primary qubit devices.

In some implementations, the techniques described here can be used to provide technical improvements and advantages in a quantum computing system. For example, operating ancilla qubit devices without dedicated control lines or readout lines can reduce the number of input/output channels needed in the quantum computing system. For instance, the ratio of input/output channels in the signal delivery system per qubit device in the quantum processor cell may be reduced, compared to some prior systems. In some cases, input/output channels can be a source of noise in the quantum processor cell, and therefore reducing the number of input/output channels can reduce the amount of noise affecting the qubit devices in the quantum processor cell. In addition, ancilla qubit devices that do not have dedicated readout devices or control resources on the chip may allow for a larger number of qubit devices to be deployed on the chip. Accordingly, a higher density of qubits (and/or a higher overall number of qubits) can be deployed on a given chip in some instances.

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple embodiments separately or in any suitable subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single product or packaged into multiple products.

A number of embodiments have been described. Nevertheless, it will be understood that various modifications can be made. Accordingly, other embodiments are within the scope of the following claims.

What is claimed is:

1. A quantum computing system comprising:
   a quantum processor cell comprising a superconducting quantum circuit system, the superconducting quantum circuit system comprising:
   a tunable-frequency primary qubit device;
   a flux-bias device coupled to the tunable-frequency primary qubit device; and
   a fixed-frequency ancilla qubit device connected only to the tunable-frequency primary qubit device; and
   a control system communicably coupled to the quantum processor cell and configured to apply a parametrically-activated two-qubit quantum logic gate to the tunable-frequency primary qubit device and the fixed-frequency ancilla qubit device, wherein the control system is configured to apply the parametrically-activated two-qubit quantum logic gate by sending, to the flux-bias device, a radio-frequency control signal that modulates the tunable-frequency primary qubit device.

2. The quantum computing system of claim 1, wherein the superconducting quantum circuit system comprises a capacitive connection that connects the tunable-frequency primary qubit device and the fixed-frequency ancilla qubit device.

3. The quantum computing system of claim 1, wherein the superconducting quantum circuit system comprises a readout resonator device connected to the tunable-frequency primary qubit device.

4. The quantum computing system of claim 3, wherein the control system is configured to detect a quantum state of the tunable-frequency primary qubit device by sending a control signal to the tunable-frequency primary qubit device through the readout resonator device.

5. The quantum computing system of claim 3, wherein the superconducting quantum circuit system comprises at least one other qubit device connected to the tunable-frequency primary qubit device.

6. The quantum computing system of claim 5, wherein the at least one other qubit device includes at least one other ancilla qubit device.

7. The quantum computing system of claim 6, wherein the at least one other qubit device includes at least one other primary qubit device.

8. The quantum computing system of claim 1, wherein the parametrically-activated two-qubit quantum logic gate comprises an iSWAP gate.

9. The quantum computing system of claim 1, wherein the parametrically-activated two-qubit quantum logic gate comprises a controlled-Z gate.

10. The quantum computing system of claim 1, wherein the control system is configured to operate the fixed-frequency ancilla qubit device as a memory qubit device without a dedicated readout device connected to the fixed-frequency ancilla qubit device.

11. The quantum computing system of claim 1, wherein the control system is configured to operate the fixed-frequency ancilla qubit device in the application of an error correcting code.

12. The quantum computing system of claim 1, wherein the quantum processor cell comprises a number of primary qubit devices, and the control system is configured to use the fixed-frequency ancilla qubit device to extend a quantum computational capacity of the quantum processor cell beyond the number of primary qubit devices in the quantum processor cell.

13. The quantum computing system of claim 1, wherein the control system is configured to:
   obtain a binary readout value by measuring a first qubit device in the quantum processor cell; and
   store the binary readout value in the fixed-frequency ancilla qubit device.

14. A quantum computing method comprising:
   storing information in a quantum processor cell comprising a superconducting quantum circuit system, the superconducting quantum circuit system comprising:
   a tunable-frequency primary qubit device;
   a flux-bias device coupled to the tunable-frequency primary qubit device; and
   a fixed-frequency ancilla qubit device connected only to the tunable-frequency primary qubit device; and
   by operation of a control system communicably coupled to the quantum processor cell, applying a parametrically-activated two-qubit quantum logic gate to the tunable-frequency primary qubit device and the fixed-frequency ancilla qubit device, wherein applying the parametrically-activated two-qubit quantum logic gate comprises sending, to the flux-bias device, a radio-frequency control signal that modulates the tunable-frequency primary qubit device.

15. The quantum computing method of claim 14, wherein the superconducting quantum circuit system comprises a readout resonator device connected to the tunable-frequency primary qubit device, and the method comprises detecting a quantum state of the tunable-frequency primary qubit device by sending a control signal to the tunable-frequency primary qubit device through the readout resonator device.

16. The quantum computing method of claim 14, wherein applying the parametrically-activated two-qubit quantum logic gate comprises applying an iSWAP gate.

17. The quantum computing method of claim 14, wherein applying the parametrically-activated two-qubit quantum logic gate comprises applying a controlled-Z gate.

18. The quantum computing method of claim 14, comprising operating the ancilla qubit device as a memory qubit device without a dedicated readout device connected to the ancilla qubit device.

19. The quantum computing method of claim 14, comprising operating the fixed-frequency ancilla qubit device in an error correcting code.

20. The quantum computing method of claim 14, wherein the quantum processor cell comprises a number of primary qubit devices, and the method comprises using the fixed-frequency ancilla qubit device to extend a quantum computational capacity of the quantum processor cell beyond the number of primary qubit devices in the quantum processor cell.

21. The quantum computing method of claim 14, comprising:
  obtaining a binary readout value by measuring a first qubit device in the quantum processor cell; and
  storing the binary readout value in the fixed-frequency ancilla qubit device.

22. The quantum computing method of claim 21, further comprising retrieving the binary readout value from the fixed-frequency ancilla qubit device.

23. A quantum computing system comprising:
  a quantum processor cell comprising a superconducting quantum circuit system, the superconducting quantum circuit system comprising:
    tunable-frequency primary qubit devices;
    flux-bias devices coupled to the respective tunable-frequency primary qubit devices;
    fixed-frequency ancilla qubit devices, each fixed-frequency ancilla qubit device connected only to a respective one of the tunable-frequency primary qubit devices; and
    connections between neighboring pairs of primary and ancilla qubit devices, each neighboring pair comprising one of the tunable-frequency primary qubit devices and one of the fixed-frequency ancilla qubit devices; and
  a control system communicably coupled to the quantum processor cell and configured to apply parametrically-activated two-qubit quantum logic gates to the neighboring pairs, wherein the control system is configured to apply the parametrically-activated two-qubit quantum logic gates by sending, to the flux-bias device coupled to the tunable-frequency primary qubit device in a respective neighboring pair, a radio-frequency control signal that modulates the tunable-frequency primary qubit device in the respective neighboring pair.

24. The quantum computing system of claim 23, comprising additional connections between neighboring pairs of primary qubit devices, each neighboring pair of primary qubit devices comprising at least one of the tunable-frequency primary qubit devices.

25. The quantum computing system of claim 23, wherein the superconducting quantum circuit system comprises readout resonator devices connected to the respective tunable-frequency primary qubit devices.

26. The quantum computing system of claim 23, wherein each of the tunable-frequency primary qubit devices is connected to exactly one of the fixed-frequency ancilla qubit devices.

27. The quantum computing system of claim 23, wherein each of the tunable-frequency primary qubit devices is connected to more than one of the fixed-frequency ancilla qubit devices.

28. The quantum computing system of claim 23, wherein the control system is configured to operate the fixed-frequency ancilla qubit devices as memory qubit devices without dedicated readout devices connected to the ancilla qubit devices.

29. The quantum computing system of claim 23, wherein the control system is configured to operate the fixed-frequency ancilla qubit devices in an error correcting code.

30. The quantum computing system of claim 23, wherein the quantum processor cell comprises a number of primary qubit devices, and the control system is configured to use the fixed-frequency ancilla qubit devices to extend a quantum computational capacity of the quantum processor cell beyond the number of primary qubit devices in the quantum processor cell.

* * * * *